United States Patent
Schulze et al.

(10) Patent No.: US 7,304,349 B2
(45) Date of Patent: Dec. 4, 2007

(54) POWER SEMICONDUCTOR COMPONENT WITH INCREASED ROBUSTNESS

(75) Inventors: Hans-Joachim Schulze, Ottobrunn (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 311 days.

(21) Appl. No.: 11/081,787

(22) Filed: Mar. 16, 2005

(65) Prior Publication Data

US 2005/0212076 A1  Sep. 29, 2005

(30) Foreign Application Priority Data

Mar. 16, 2004  (DE) ................ 10 2004 012 819

(51) Int. Cl.
*H01L 29/76* (2006.01)
(52) U.S. Cl. ...................... 257/341; 257/750
(58) Field of Classification Search ............... 257/341, 257/502, 750
See application file for complete search history.

(56) References Cited

U.S. PATENT DOCUMENTS

| | | | |
|---|---|---|---|
| 4,500,898 A * | 2/1985 | Cline | 257/341 |
| 4,593,302 A * | 6/1986 | Lidow et al. | 257/342 |
| 4,692,781 A | 9/1987 | Rountree et al. | |
| 4,990,994 A | 2/1991 | Furukawa et al. | |
| 5,156,998 A | 10/1992 | Chi et al. | |
| 5,442,200 A | 8/1995 | Tischler | |
| 6,309,965 B1 | 10/2001 | Matschitsch et al. | |
| 6,351,024 B1 | 2/2002 | Ruff et al. | |
| 7,015,562 B2 * | 3/2006 | Mauder et al. | 257/502 |
| 2003/0020174 A1 | 1/2003 | Kohno | |

FOREIGN PATENT DOCUMENTS

| | | |
|---|---|---|
| DE | 29 30 779 C2 | 8/1983 |
| DE | 41 01 274 A1 | 3/1992 |
| DE | 36 32 209 C2 | 5/1993 |
| DE | 198 40 239 A1 | 3/2000 |
| GB | 2 247 779 A | 3/1992 |

OTHER PUBLICATIONS

Geib et al., "Reaction Between SiC and W, Mo, and Ta at Elevated Temperatures", Journal of Applied Physics, vol. 68, No. 6, Sep. 1990, pp. 2796-2800, (5 pages).

Waldrop et al., "Schottky Barrier Height and Interface Chemistry of Annealed Metal Contacts to Alpha 6H-SiC: Crystal Face Dependence", Applied Physics Letters, vol. 62, No. 21, May 1993, pp. 2685-2687, (3 pages).

* cited by examiner

*Primary Examiner*—Mark V. Prenty
(74) *Attorney, Agent, or Firm*—Maginot, Moore & Beck

(57) ABSTRACT

The invention relates to a power semiconductor component with increased robustness, in which a contact layer (13, 14) applied directly to a main surface (7, 11) of the semiconductor body (1) is composed of a metal (13) having a high melting point or of a thin aluminum layer (14), the layer thickness of which preferably lies between 1 and 5 nm. This contact layer is reinforced with a customary multilayer metallization system (15). The aluminum layer may, if appropriate, be patterned (14').

18 Claims, 1 Drawing Sheet

POWER SEMICONDUCTOR COMPONENT WITH INCREASED ROBUSTNESS

Figure 1:
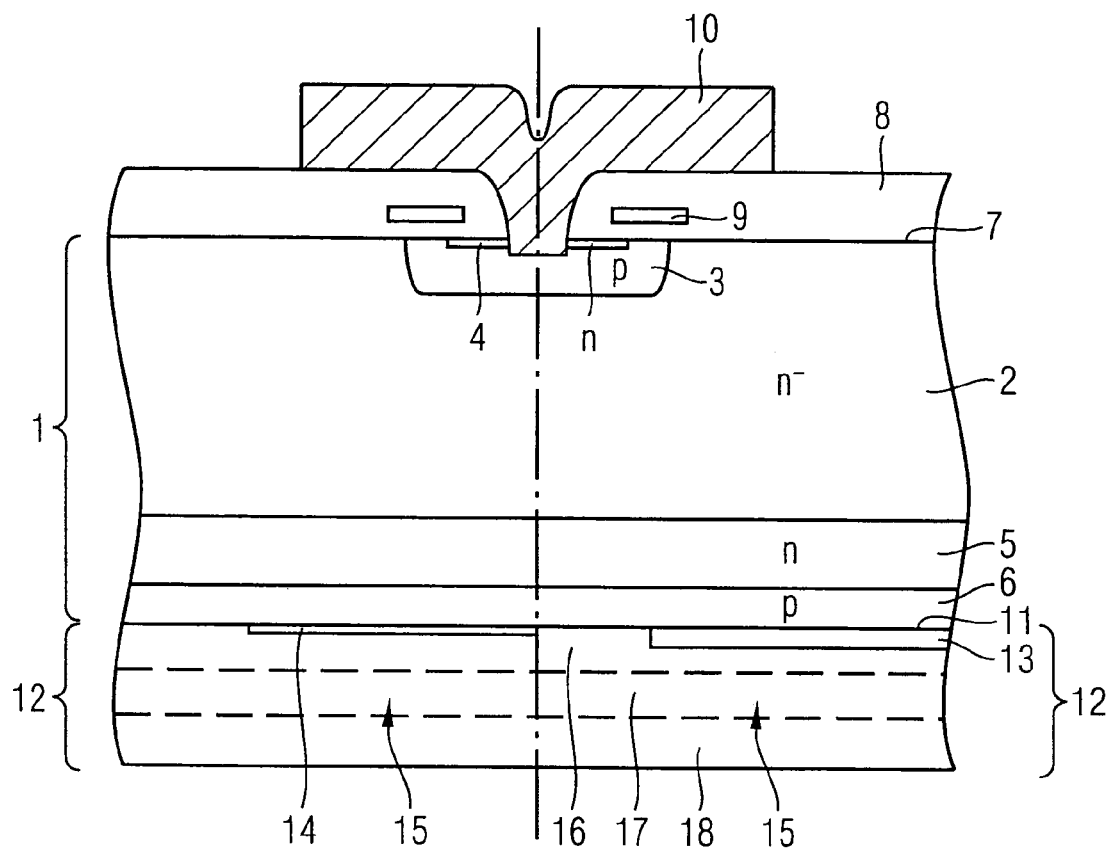

The present invention relates to a power semiconductor component with increased robustness, comprising a semiconductor body having a first main surface on a front side of the semiconductor body and a second main surface, situated opposite to the first main surface, on a rear side of the semiconductor body, a first metallization arranged on the first main surface, and a second metallization arranged on the second main surface.

It has long been endeavored to increase the electrical and thermal loadability of power semiconductor components, such as, in particular, vertical power semiconductor components. This preferably applies to dynamic loading such as occurs for example in the event of turn-off operations, effects of cosmic radiation, short circuits, turn-on operations or surge currents. This is because very high current densities can occur in power semiconductor components in the event of such dynamic loading. This applies particularly when so-called current filaments are formed, which, in the case of vertical power semiconductor components, may move in the lateral direction of the components and may stay at inhomogeneous locations in respect of doping or lifetime of the charge carriers in the semiconductor body of the power semiconductor component, that is to say at specific locations of the power semiconductor component.

Such phenomena that are caused in particular by current filaments may lead to severe local heating of the power semiconductor component and damage the latter even through to its complete destruction. Less critical damage, but damage that is nonetheless extremely undesirable, can be seen in a permanent rise in leakage currents.

In order to increase the loadability of power semiconductor components, numerous different measures have already been contemplated: optimization of the edge termination, minimization of the electric field strengths that occur in the event of loading in the inner region or cell array of the power semiconductor component by means of suitable doping profiles, improvement of the heat dissipation or introduction of the so-called HDR principle (HDR=High Dynamic Robustness; cf. U.S. Pat. No. 6,351,024) with increased recombination center density in the edge region.

DE 198 40 239 A1 discloses a power semiconductor component in which, in order to prevent a metallization from melting on account of electrostatic discharges caused by cosmic radiation, a contact metal having a high melting point, such as, for example, titanium (Ti), vanadium (V), niobium (Nb), tantalum (Ta), molybdenum (Mo) or tungsten (W), is provided specifically for the metallization on the front side. In this case, the metallization may have a multilayer structure in which, by way of example, a further metal layer made of aluminum (Al), for example, is additionally arranged on a layer made of Ti or W provided directly on the front side of the semiconductor body. The layer made of the contact metal having a high melting point in this case has a layer thickness of between approximately 100 nm and 3 µm.

Furthermore, U.S. Pat. No. 4,692,781 discloses a power semiconductor component in which a relatively large distance is kept between a metallization and a pn junction in order to prevent damage caused by the metallization melting on account of electrostatic discharges.

Finally, DE 41 01 274 A1 describes a power semiconductor component in which, after deposition of a gate electrode layer made of polycrystalline silicon, the structure thus obtained has applied to it, by means of CVD (Chemical Vapor Deposition), a heat-resistant metal layer or metal layer having a high melting point and also a metal silicide layer in stacked fashion.

The introduction of the measures mentioned above has had the effect that correspondingly configured power semiconductor components can be dynamically loaded to a significantly greater extent than power semiconductor components in which these measures are not employed. Despite these measures, however, extreme power densities can still occur in the power semiconductor components in the event of the dynamic operations mentioned in the introduction. Said power densities may even become so high that the eutectic point of aluminum and silicon, in the case of a semiconductor body composed of silicon, is considerably exceeded at least for a short time. This effect is less critical for the first main surface or front side of the power semiconductor component since damage is hardly caused there owing to the relatively short period of time during which the eutectic point is exceeded. However, it is of great significance for the second main surface or rear side of the power semiconductor component. This is because said rear side usually exhibits better heat dissipation since the power semiconductor component is applied to a carrier by its rear side. Moreover, the highest power in the power semiconductor component is dissipated in the region of a pn junction located near the front side. Therefore, the rear side is generally cooler than the front side. This has consequences for what is referred to as thermomigration:

Specifically, experiments have shown that, in a semiconductor body, thermomigration proceeds from the cooler side and propagates to the warmer side from the latter. In other words, thermomigration arises in the region of the rear side as soon as the temperature there exceeds the eutectic point of aluminum and silicon.

If the semiconductor body is composed of silicon carbide, for example, instead of silicon, then the eutectic point of a contact metal having a high melting point and silicon carbide is to be assumed in this respect, of course. The same also applies to other semiconductor materials, such as $A_{III}B_V$ compound semiconductors, for example.

Thermomigration has the effect that, if the second metallization on the second main surface is composed of aluminum, for example, this aluminum can indiffuse relatively rapidly into the semiconductor body. This diffusion proceeds all the more rapidly, the steeper the temperature gradient in the vertical direction of the semiconductor body.

Very steep temperature gradients can occur especially in the case of filaments caused by cosmic radiation, short circuit or extreme switching operations, with the result that the aluminum can penetrate or migrate relatively deep into the semiconductor body. In the course of this migration, a eutectic mixture forms at the end of the respective migration channel in the depth of the semiconductor body, that is to say for example in the depth of the silicon wafer. Said eutectic mixture may have a considerable influence on the properties of the power semiconductor component, specifically by virtue of significantly increased leakage currents occurring. As a result of this and also as a result of the p-type doping produced by the migration of the aluminum atoms along the migration path, the efficiency of the rear-side emitter is considerably altered and, in the worst-case situation, the power semiconductor component may finally completely fail or be destroyed.

The following could be contemplated as remedial measures against the effects of thermomigration:

The rear-side emitter, that is to say generally the p-conducting emitter in the case of an IGBT (insulated gate bipolar transistor) and generally the n-conducting emitter in the case of a diode, is to be doped as highly as possible and is to be indiffused deep into the semiconductor body or the semiconductor wafer. It has been shown that diodes which have an extremely large penetration depth of the n-conducting emitter with a value of more than 100 µm precisely exhibit high strength to withstand cosmic radiation. It is thus possible quite generally to achieve a higher turn-off robustness by means of a stronger rear-side emitter. By virtue of this higher turn-off robustness, undesirable stable increases in the leakage current occur only at higher turn-off powers. A leakage current increase or destructions occur only at higher reverse voltages, that is to say that they are present when the space charge zone that is established when the reverse voltage is applied to the two metallizations penetrates into the rear-side region of the power semiconductor component. In the case of IGBTs, a reinforcement of the p-conducting emitter has a positive effect on the short-circuit behavior, which also holds true for a reduction of the temperature gradient in the semiconductor body by means of a flatter field distribution, as in the case of a PT-IGBT (PT=punch through), for example.

What is disadvantageous about all the above remedial measures, however, is that they involve making the emitter significantly stronger than is generally desired. In order to prevent the turn-off losses on account of this stronger design of the emitters from becoming excessively high, it is therefore necessary to provide for a reduction of these turn-off losses. This is possible through a targeted, generally vertically inhomogeneous setting of the lifetime of the charge carriers for example by means of proton irradiation or helium irradiation.

Finally, as a further remedial measure against thermomigration, it might be conceivable to flatten the temperature gradient in the semiconductor body such that the rate of migration of aluminum is reduced. For this purpose, the use of high-purity silicon containing fewer isotopes could provide for increasing the thermal conductivity in silicon. However, the use of such a high-purity material is very costly and the improvement that can thereby be achieved can only be regarded as marginal.

An opposite method is to deliberately raise the temperature gradient in the semiconductor body in order that the rear-side temperature remains below the eutectic point. This method can also be regarded as not very successful since, in this method, the temperature level is raised overall and builds up further for example as a result of an increase in the leakage current.

Therefore, it is an object of the present invention to specify a power semiconductor component in which local excessive current increases on account of aluminum that has penetrated undesirably deep into the rear side of the component as a result of electrical loading thereof, to be precise for example due to thermomigration, are largely prevented, so that the electrical loadability of this power semiconductor component is increased.

In the case of a power semiconductor component of the type mentioned in the introduction, this object is achieved according to the invention by virtue of the fact that at least one of the two metallizations has a contact layer as a layer applied directly on the corresponding main surface of the semiconductor body, said contact layer being composed of aluminum having a layer thickness of between 1.0 and 40 nm. The layer thickness preferably lies between 1.0 and 5 nm. However, if atoms of the semiconductor material of the semiconductor body, that is to say silicon atoms in the case of a semiconductor body composed of silicon, are still incorporated into the contact layer, then the layer thickness of the contact layer may lie between 1 and 100 nm, and in particular between 1.0 and 40 nm. However, it may also be very thin and amount to just 1.0 to 10 nm.

In the case of a power semiconductor component of the type mentioned in the introduction, the above object is also achieved according to the invention by virtue of the fact that at least the metallization provided on the second main surface, that is to say the rear side of the semiconductor body, has a contact layer as a layer applied directly on said second main surface, said contact layer being composed of a metal having a high melting point. The layer thickness of said contact layer may be greater than the layer thickness of the contact layer composed of aluminum (with or without incorporated semiconductor atoms). However, it may also be thin and advantageously assume values of between 1.0 and 100 nm.

A customary multilayer metallization system is applied on the thin aluminum layer—as well as on the layer made of metal having a high melting point or metal silicide—in order to complete the respective metallization in this way. Said multilayer metallization system may comprise for example titanium nitride, nickel, silver, etc. This application and also a subsequent heat treatment are effected in a customary manner.

In the case of the power semiconductor component according to the invention, then, a thin aluminum layer is applied as a direct contact layer of a metallization to the rear side and/or front side of the semiconductor body or, instead of said aluminum layer, a layer made of metal having a high melting point or metal silicide is applied as a direct contact layer only to the rear side of the semiconductor body and, if appropriate, also the front side. Such metals having a high melting point are for example titanium, tantalum, tungsten, molybdenum, chromium or cobalt or silicide of these metals or titanium nitride or tantalum nitride. Preferably, the rear side of the semiconductor body is provided with the metallization according to the invention with a thin aluminum layer or a layer made of metal having a high melting point as contact layer. In this case, on the front side, as previously, it is possible to use a readily patternable conventional aluminum contact for the first metallization. If appropriate, diffusion barriers may additionally be incorporated in this case. However, it is also possible, of course, to configure both the rear side (second metallization) and the front side (first metallization) of the semiconductor body in accordance with the present invention. Furthermore, it is also possible for only the front side, that is to say the first metallization, to be formed with the metallization according to the invention with a thin aluminum layer.

In the case of the power semiconductor component according to the invention, therefore, the surface of the semiconductor body on the front side and/or rear side does not come into direct contact with a metallization principally composed of aluminum.

The thickness of the thin aluminum layer should be so small that an Al/Si drop large enough to be able to penetrate into the depth of the semiconductor body does not form. Suitable layer thicknesses typically lie between 0.5 and 40 nm, and preferably between 1 and 5 nm. At layer thicknesses of less than 2 nm, provision should be made for cooling the semiconductor body during the deposition of this layer in order to reduce the surface mobility of the aluminum atoms on the surface of the semiconductor body, thereby reducing a critical mean mass occupancy above which the thin aluminum layer undergoes transition from a grain structure to a contiguous layer.

An advantageous development of the invention consists in the thin aluminum layer that is deposited on the surface of the semiconductor body being patterned before the application of the multilayer metallization system with diffusion barriers. It is thereby possible to minimize migration effects further because the patterning of the aluminum layer limits the quantity of aluminum available for migration: a lateral reflow of aluminum is prevented and the total quantity of aluminum available for the migration process is thus limited. The lateral extent and the optimum spacing of the aluminum islands that remain after patterning primarily depend on the thickness of the aluminum layer.

Silicon may also additionally be incorporated into the thin aluminum layer in order to obstruct the penetration of aluminum into the semiconductor body composed of silicon. This measure permits the thickness of the aluminum layer deposited on the surface of the semiconductor body to be increased, to be precise to 80 to 100 nm, for example. The additions of silicon in an aluminum layer in the case of a semiconductor body composed of silicon should be approximately in the range of between 1% by weight and 4% by weight of the aluminum.

The power semiconductor component according to the invention is preferably a diode or an IGBT. However, a MOS transistor or a thyristor may also be involved in this case. The application of the invention is particularly advantageous especially in the case of a thyristor with an "amplifying gate" structure since here the inner "amplifying gates" are loaded with very high current densities during turn-on with a high current gradient di/dt (i=current intensity, t=time) and, in contrast to the cathode area, are not cooled by means of a pressure contact on the cathode side. It then suffices, if appropriate, to apply the measures specified in the case of the invention only in an inner region, that is to say in the region of the "amplifying gate" structure, since the highest temperatures occur here during turn-on.

It may quite generally also suffice, in the case of other power semiconductor components, if the measures according to the invention are applied only in the regions in which particularly high temperatures occur during operation of the power semiconductor component, such as, for example in the case of diodes in which the HDR principle is not provided, in the edge region, where the highest dynamic loading occurs during the turn-off operation.

The power semiconductor component according to the invention thus dispenses, in particular, with the hitherto customary rear-side metallization made of thick aluminum in order to avoid the penetration of aluminum into the semiconductor body, to be precise in particular the thermomigration effect; the application of this measure is particularly recommendable if the region below the surface onto which the metallization is deposited is amorphized, since this amorphization facilitates the penetration of aluminum. Instead of thick aluminum, a layer made of a metal having a high melting point or a thin aluminum layer having a thickness of between preferably 1 and 5 nm is applied, and afterward the layer made of the metal having a high melting point or the thin aluminum layer is then reinforced with the customary multilayer metallization system. A thin aluminum layer may additionally be patterned; thereby reducing the quantity of aluminum atoms penetrating into the surface of the semiconductor body. Moreover, up to 4% by weight of semiconductor material—in particular silicon—may additionally be incorporated into the aluminum layer.

Figure 2:
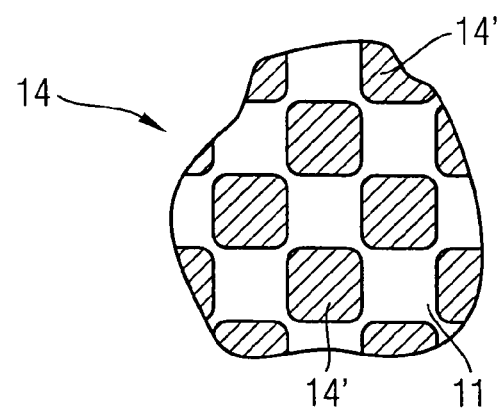

The invention is explained in more detail below with reference to the drawings, in which:

FIG. 1 shows a sectional view of an IGBT, two different variants of the power semiconductor component being shown on the left and right of a center line indicated in dash-dotted fashion, and FIG. 2 shows a plan view of a patterned thin aluminum layer.

FIG. 1 shows a section through an IGBT having a semiconductor body or chip 1 made preferably of silicon or another suitable semiconductor material, such as, for example, silicon carbide (SiC) or an $A_{III}B_v$ compound semiconductor, such as, in particular, gallium arsenide. In this semiconductor body 1, a p-conducting base zone 3 is introduced into an n⁻-conducting base zone 2, an n- or n⁺-conducting source or emitter zone 4 being situated in said base zone 3. Furthermore, the semiconductor body 1 has an n- or n⁺-conducting field stop zone 5 and also a p-conducting collector zone 6. It goes without saying that the conduction types specified may also be respectively reversed.

If only the zones 3 (p-conducting), 2 (n⁻-conducting) and, if appropriate, 5 (n-conducting) are provided, then a diode is present. The emitter zone 4 and the collector zone 6 are thus omitted in this case. The following considerations for an IGBT hold true in the same way for a diode having a construction of this type or a similar construction.

An insulating layer 8 made, for example, of silicon dioxide and/or silicon nitride is situated on a first main surface 7 of the semiconductor body 1. A gate electrode 9 made, in particular, of polycrystalline silicon is introduced into said insulating layer 8. A diode, of course, does not have such a gate electrode.

In the first main surface 7, the emitter zone 4 and the p-type base zone 3 are contact-connected via a first contact (emitter contact) in the form of a first metallization 10.

A second main surface 11 of the semiconductor body 1 opposite to the first main surface 7 is provided with a second contact (collector contact) in the form of a second metallization 12.

The subject matter of the invention, then, is the configuration of the second metallization 12. It should be expressly emphasized that the first metallization 10 can also be embodied in the same way as the second metallization 12. Moreover, the first metallization 10 can be configured in accordance with the invention, while the metallization 12 is patterned in a conventional manner. Quite generally, in the case of a power semiconductor component having n contacts, it is possible for all n contacts, n-1 contacts, etc. and just one contact to be formed in the manner according to the invention.

FIG. 1, then, shows two different variants for the patterning of the metallization 12 according to the invention.

A thin aluminum layer 14 having a layer thickness of 1 to 40 nm, preferably of 1 to 5 nm, is illustrated in the left-hand half. Silicon additions with a proportion of approximately 1% by weight to 4% by weight may be incorporated into said aluminum layer 14. In the case of incorporated silicon additions, the layer thickness may then be up to 100 nm.

The aluminum layer 14 may extend continuously over the entire main surface 11 of the semiconductor body 1. However, it is also possible for this aluminum layer 14—as illustrated—to be provided only in a region having particularly high temperatures, for example in the inner region, of the power semiconductor component.

In the right-hand half of FIG. 1, a layer 13 made of a metal having a high melting point or metal silicide is provided instead of the aluminum layer 14. Suitable materials for the metal having a high melting point are for example titanium, tantalum, tungsten, molybdenum, chromium or cobalt. Such a layer 13 is preferably deposited onto an amorphized or at least partially amorphized surface of the semiconductor body 1.

In contrast to the aluminum layer 14, the layer 13 made of metal having a high melting point may have a larger layer thickness of the order of magnitude of a few µm. However, the layer 13 may preferably also have a small thickness of, for example, just 10 to 100 nm.

Like the aluminum layer 14, the layer 13 made of metal having a high melting point may extend over the entire main surface 11. However, it may also be provided only in those regions in which particularly high temperatures are expected, for example at the edge of the power semiconductor component.

In both variants of the left-hand and right-hand halves of FIG. 1, a multilayer metallization system 15 is in each case additionally applied to the aluminum layer 14 and, respectively, to the layer 13 made of metal having a high melting point. Said multilayer metallization system 15 may comprise, in a conventional manner, for example a titanium nitride layer 16, a nickel layer 17 and a silver layer 18. Other materials are also possible for said multilayer metallization system 15.

FIG. 2 shows another possibility of variation for the configuration of the aluminum layer 14 in a plan view: this aluminum layer 14 may comprise individual regions 14' applied in insular fashion to the surface 11 of the semiconductor body 1. Such patterning prevents a lateral reflow of aluminum. The size of the aluminum islands thus formed and the distance between the individual aluminum islands 14' depend on the thickness of the aluminum layer 14.

LIST OF REFERENCE SYMBOLS

1 Semiconductor body
2 n⁻-conducting base zone
3 p-conducting base zone
4 Emitter zone
5 Field stop zone
6 Collector zone
7 First main surface
8 Insulating layer
9 Gate electrode
10 First metallization
11 Second main surface
12 Second metallization
13 Layer made of metal having a high melting point
14 Aluminum layer
14' Patterned aluminum layer
15 Multilayer metallization system
16 Titanium nitride layer
17 Nickel layer
18 Silver layer

The invention claimed is:

1. An arrangement for use in a power semiconductor component, comprising:
    a semiconductor body having a first main surface on a front side of the semiconductor body and a second main surface, situated opposite to the first main surface, on a rear side of the semiconductor body,
    a metallization arranged on at least one of the first main surface or the second main surface, the metallization having a contact layer applied directly on the corresponding main surface of the semiconductor body, said contact layer being composed of aluminum and having a layer thickness of between 1 and 40 nm, wherein said contact layer is patterned.

2. The arrangement of claim 1, wherein the contact layer has a layer thickness of between 1 and 5 nm.

3. The arrangement as claimed in claim 1, wherein the contact layer is disposed on the rear side of the semiconductor body.

4. The arrangement as claimed in claim 1, wherein the layer thickness of the contact layer composed of aluminum lies between 1.0 and 5 nm.

5. The arrangement as claimed in claim 1, wherein the contact layer is applied directly on the second main surface of the semiconductor body.

6. A power semiconductor component, comprising:
    a semiconductor body having a first main surface on a front side of the semiconductor body and a second main surface, situated opposite to the first main surface, on a rear side of the semiconductor body,
    a first metallization arranged on the first main surface, and
    a second metallization arranged on the second main surface, the second metallization having a contact layer applied directly on said second main surface, said contact layer being composed of a metal having a high melting point, and said contact layer having a layer thickness of 1.0 to 100 nm.

7. The power semiconductor component as claimed in claim 6, wherein the first metallization further comprises a contact layer applied to the first main surface, the contact layer of the first metallization made of metal having a high melting point.

8. The power semiconductor component as claimed in claim 6, wherein the metal having the high melting point includes one of a group consisting of titanium, tantalum, tungsten, molybdenum, chromium, cobalt, and a silicide of titanium, a silicide of tantalum, a silicide of tungsten, a silicide of molybdenum, a silicide of chromium, a suicide of cobalt, titanium nitride and tantalum nitride.

9. The power semiconductor component as claimed in claim 6, wherein the second metallization is a multilayer metallization including titanium nitride (TiN), nickel (Ni) and silver (Ag).

10. The power semiconductor component as claimed in claim 6, wherein the second metallization is a multilayer metallization having aluminum incorporated therein.

11. The power semiconductor component as claimed in claim 6, wherein the contact layer disposed only in one of a group consisting of an edge region of the second main surface and an inner region of the second main surface.

12. The power semiconductor component as claimed in claim 6, wherein a region within the semiconductor body inward of the second main surface comprises an at least partially amorphized region.

13. An arrangement for use in a power semiconductor component with increased robustness, comprising:
    a semiconductor body having a first main surface on a front side of the semiconductor body and a second main surface, situated opposite to the first main surface, on a rear side of the semiconductor body,
    a metallization arranged on at least one of the first main surface or the second main surface, the metallization having a contact layer applied directly on the corresponding main surface of the semiconductor body, said contact layer being composed of aluminum, into which atoms of the semiconductor material of the semiconductor body are incorporated, and having a layer thickness of between 1.0 and 100 nm.

14. The arrangement of claim 13, wherein the contact layer has a layer thickness of between 1.0 and 10 nm.

15. The arrangement as claimed in claim 14, wherein the semiconductor body is composed of silicon, and up to 4% by weight of silicon atoms are incorporated into the contact layer composed of aluminum.

16. The arrangement as claimed in claim 15, wherein the contact layer has a layer thickness of 1.0 to 40 nm.

17. The arrangement as claimed in claim 13, wherein the contact layer comprises a patterned contact layer.

18. A power semiconductor component with increased robustness, comprising:
   a semiconductor body having a first main surface on a front side of the semiconductor body and a second main surface, situated opposite to the first main surface, on a rear side of the semiconductor body,
   a first metallization arranged on the first main surface, the first metallization having a contact layer applied directly on said first main surface, said contact layer being composed of a metal having a high melting point and having a layer thickness of 1.0 to 100 nm; and
   a second metallization arranged on the second main surface, the second metallization having a contact layer applied directly on said second main surfaces, said contact layer being composed of a metal having a high melting point and having a layer thickness of 1.0 to 100 nm.

* * * * *